United States Patent [19]
Usami et al.

[11] Patent Number: 6,124,213
[45] Date of Patent: Sep. 26, 2000

[54] PROCESS OF FABRICATING SEMICONDUCTOR DEVICE HAVING ASHING STEP FOR PHOTO-RESIST MASK IN PLASMA PRODUCED FROM $N_XH_Y$ GAS

[75] Inventors: Tatsuya Usami; Kouichi Ohto; Yasuhiko Ueda, all of Tokyo, Japan

[73] Assignee: NEC Corporation, Tokyo, Japan

[21] Appl. No.: 09/192,476

[22] Filed: Nov. 17, 1998

[30] Foreign Application Priority Data

Nov. 18, 1997 [JP] Japan ..................................... 9-316931

[51] Int. Cl.$^7$ ....................................................... H01H 1/00
[52] U.S. Cl. .......................... 438/710; 438/708; 438/725; 438/743
[58] Field of Search .................... 438/708, 710, 438/725, 743

[56] References Cited

U.S. PATENT DOCUMENTS

| | | | |
|---|---|---|---|
| 5,506,177 | 4/1996 | Kishimoto et al. ...................... | 437/195 |
| 5,888,309 | 3/1999 | Yu ............................................ | 134/1.2 |
| 5,970,376 | 10/1999 | Chen ........................................ | 438/637 |
| 6,010,965 | 1/2000 | Shelds ....................................... | 438/700 |
| 6,013,576 | 1/2000 | Wang et al. .............................. | 438/692 |
| 6,019,906 | 2/2000 | Jang et al. ................................. | 216/2 |

FOREIGN PATENT DOCUMENTS 9-36089  2/1997  Japan .

OTHER PUBLICATIONS

Japanese Office Action dated Sep. 9, 1999, with partial translation.

Hasegawa, et. al., Process Technology for Devices, "Groping for Low Dielectric Constant Material Available for Inter–level Layer" "Low Dielectric Constant Achieved by Using Fluorine–Contained Resin Etching", Semiconductor World, Feb. 1997, pp. 82–84, with partial translation.

Furusawa, et. al., "Low Capacitance Multilevel Interconnection Using Low–E Organic Spin–on Glass for Qyuarter–Micron High–Speed ULSIs", 1995 Symposium on VLSI Technology Digest of Technical Papers, pp. 59–60.

Primary Examiner—Benjamin L. Utech
Assistant Examiner—Vanessa Perez-Ramos
Attorney, Agent, or Firm—McGinn & Gibb, P.C.

[57] ABSTRACT

A photo-resist mask is removed from an inter-level insulating structure by using plasma produced from $N_xH_y$ gas, and the plasma does not make an organic insulating layer forming part of the inter-level insulating structure hygroscopic, because $SiCH_3$ bond is never replaced with Si—OH bond during the removal of the photo-resist mask.

11 Claims, 9 Drawing Sheets

PROCESS OF FABRICATING SEMICONDUCTOR DEVICE HAVING ASHING STEP FOR PHOTO-RESIST MASK IN PLASMA PRODUCED FROM $N_XH_Y$ GAS

FIELD OF THE INVENTION

This invention relates to a fabrication technology for a semiconductor integrated circuit device and, more particularly, to a process of fabricating a semiconductor integrated circuit device having an ashing step for an inter-level insulating layer to be damaged in the presence of oxygen plasma.

DESCRIPTION OF THE RELATED ART

An ultra large scale integration requires a multi-level wiring, and an inter-level insulating layer electrically isolates signal lines on a lower level from signal lines on an upper level. Various structures have been proposed for the inter-level insulating layer. One of the inter-level insulating structures is disclosed by Furusawa et. al. in "Low Capacitance Multilevel Interconnection Using Low-εOrganic Spin-on Glass for Quarter-Micron High-Speed ULSIs", 1995 Symposium on VLSI Technology Digest of Technical Papers, pages 59 to 60. The inter-level insulating layer proposed in the paper has an organic spin-on glass layer sandwiched between silicon oxide layers produced from compound abbreviated as "TEOS (Tetra-Ethyl Ortho-Silicate)" decomposed with the assistance of plasma discharge. The silicon oxide produced from TEOS with the assistance of plasma discharge is hereinbelow simply referred to as "plasma TEOS oxide". The organic spin-on glass has the composition expressed by the following chemical formula.

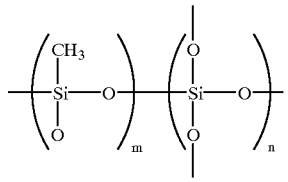

When a lower conductive strip is covered with the inter-level insulating structure, a photo-resist etching mask is patterned on the inter-level insulating structure by using a photolithography, and the inter-level insulating structure is selectively etched away so as to form a contact hole in the inter-level insulating layer. Upon completion of the etching, the photo-resist etching mask is ashed by oxygen plasma, and the oxygen plasma destroys Si—$CH_3$ bond in the organic spin-or glass. The silicon atom is bonded to hydroxyl group OH. However, the Si—OH bond is hygroscopic, and is causative of undesirable increase of resistance in the contact hole. The hygroscopic organic spin-on glass layer has a dielectric constant greater than that of a non-hygroscopic organic spin-on glass.

FIG 1A to 1G illustrate the prior art process for forming a contact hole in the prior art inter-level insulating layer proposed in the paper. The process starts with preparation of an intermediate semiconductor structure, which has a plasma TEOS oxide layer 1 on a silicon substrate 2. The intermediate semiconductor structure further has conductive strips 3a/3b formed of aluminum and an inter-level insulating structure 4 extending over the conductive strips 3a/3b and the plasma TEOS oxide layer 1.

The inter-level insulating structure 4 consists of a lower plasma TEOS oxide layer 4a, an organic spin-on glass layer 4b laminated on the lower plasma TEOS oxide layer 4a and an upper plasma TEOS oxide layer 4c laminated on the organic spin-on (lass layer 4b. The lower plasma TEOS oxide layer 4a is 1000 angstroms thick, and conformably extends over the conductive strips 3a/3b. The organic spin-on glass layer 4b is spun onto the lower plasma TEOS oxide layer 4a, and is baked so as to be 4000 angstroms thick. The step coverage is improved by the organic spin-on glass layer 4b. The upper plasma TEOS oxide layer 4c is firstly deposited to 8000 angstroms thick, and is subjected to a chemical mechanical polishing. The chemical mechanical polishing creates a flat surface of the upper plasma TEOS oxide layer 4c as shown in FIG. 1A, and decreases the thickness of the upper plasma TEOS oxide layer 4c to 5000 angstroms.

Subsequently, photo-resist solution is spread over the upper plasma TEOS oxide layer 4c, and is baked so that the inter-level insulating structure 4 is covered with a photo-resist layer. A pattern image for a contact hole is transferred from a photo mask (not shown) to the photo-resist layer, and forms a latent image in the photo-resist layer. The latent image is developed, and the photo-resist layer is formed into a photo-resist etching mask 5. The photo-resist etching mask 5 has an opening over the conductive strip 3a as shown in FIG. 1B.

Using the photo-resist etching, mask 5, the plasma TEOS oxide layers 4a/4b and the organic spin-on glass layer 4b are selectively etched by using an gaseous etcher in fluorocarbon system. A contact hole 6a is formed in the inter-level insulating structure 4 as shown in FIG. 1C.

The resultant semiconductor structure shown in FIG. 1C is placed in a reaction chamber of an ashing system, and the photo-resist etching mask 5 is exposed to oxygen plasma as shown in FIG. 1D. The oxygen is supplied to the reactor chamber, and the flow rate is regulated to 2 slm. The reactor chamber is at 250 degrees in centigrade, and the plasma generator is operating at 1000 watts. The lamp power is 25 percent, and the photo-resist etching mask 5 is ashed at 12000 angstroms per minute. While the oxygen plasma is ashing the photo-resist etching mask 5, Si—$CH_3$ bond in the organic spin-on glass layer 4b is replaced with Si—OH bond, and the Si—OH bond makes the organic spin-on glass layer 4b hygroscopic.

Titanium is deposited to 500 angstroms thick, and a titanium layer 7a conformably extends over the exposed surface of the inter-level insulating structure 4. Subsequently, titanium nitride is deposited to 500 angstroms thick, and a titanium nitride layer 7b is laminated on the titanium layer 7a. The titanium nitride layer 7b defines a recess 6b in the contact hole 6a. Tungsten is deposited to 5000 angstroms thick. The tungsten fills the recess 6b, and forms a blanket tungsten layer 7c as shown in FIG. 1E.

The blanket tungsten layer 7c, the titanium nitride layer 7b and the titanium layer 7a are successively etched without any etching mask until the inter-level insulating structure 4 is exposed, again. The titanium layer 7a and the titanium nitride layer 7b are left on the inner side surface of the inter-level insulating structure 4, and a tungsten plug 7d fills the recess 6b as shown in FIG 1F.

Conductive material in the aluminum system is deposited over the entire surface of the resultant semiconductor structure, and forms a conductive layer. A photo-resist etching mask (not shown) is patterned on the conductive layer, and the conductive layer is selectively etched away so that an upper metal conductive strip 8 is left on the inter-level insulating structure 4 as shown in FIG. 1G. The upper conductive strip 8 is held in contact with the tungsten plug 7d, and the tungsten plug 7d, the titanium nitride layer 7b and the titanium layer 7a are expected to transfer an electric signal between the upper conductive strip 8 and the lower conductive strip 3a. However, the Si—OH bond causes the inside of the contact hole to get damp, and the damp is causative of erosion. The lower conducive strip 3a and/ or the upper conductive strip 8 are eroded, and the electrical contact becomes a poisoned via. Even if the organic spin-on glass layer 4b is replaced with a hydrogen silsesquioxane layer, Si—H bond is replaced with Si—OH bond, and the inter-level insulating layer also becomes hygroscopic. This is the problem inherent in the prior art inter-level insulating structure disclosed in the paper.

Another inter-level insulating structure is disclosed in monthly magazine "Semiconductor World", Feb. 1997, pages 82 to 84. The Semiconductor World teaches to use a fluoro polymer in an inter-level insulating structure.

FIGS. 2A to 2D illustrate a process for fabricating the prior art semiconductor device disclosed in the monthly magazine. The process starts with preparation of an intermediate semiconductor structure, which has a plasma TEOS oxide layer 11 on a silicon substrate 12. The intermediate semiconductor structure further has lower conductive strips 13a/13b formed of conductive material in the aluminum system and an inter-level insulating structure 14 extending over the lower conductive strips 13a/13b and the plasma TEOS oxide layer 11 exposed between the lower conductive strips 13a/13b.

The inter-level insulating structure 14 consists of a lower plasma TEOS oxide layer 14a, a fluoro polymer layer 14b laminated on the lower plasma TEOS oxide layer 14a and an upper plasma TEOS oxide layer 14c laminated on the fluoro polymer layer 14b. A typical example of the fluoro polymer is expressed by the following chemical formula.

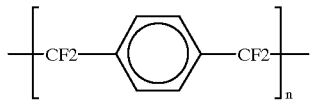

The lower plasma TEOS oxide layer 14a is 500 angstroms thick, and conformably extends over the lower conductive strips 13a/13b. The fluoro polymer layer 14b is spread over the lower plasma TEOS oxide layer 14a, and is baked so as to be 5000 angstroms thick. The step coverage is improved by the fluoro polymer layer 14b. The upper plasma TEOS oxide layer 14c is firstly deposited to 8000 angstroms thick, and is subjected to a chemical mechanical polishing. The chemical mechanical polishing creates a flat surface of the upper plasma TEOS oxide layer 14c as shown in FIG. 2A, and decreases the thickness of the upper plasma TEOS oxide layer 14c to 5000 angstroms.

Subsequently, photo-resist solution is spread over the upper plasma TEOS oxide layer 14c, and is baked so that the inter-level insulating structure 14 is covered with a photo-resist layer. A pattern image for a contact hole is transferred from a photo mask (not shown) to the photo-resist layer, and forms a latent image in the photo-resist layer. The latent image is developed, and the photo-resist layer is formed into a photo-resist etching mask 15. The photo-resist etching mask 15 has an opening over the lower conductive strip 13a as shown in FIG. 2B.

Using the photo-resist etching mask 15, the plasma TEOS oxide layers 14a/14c and the fluoro polymer layer 14b are selectively etched by using an gaseous etcher in fluorocarbon system. A contact hole 16a is formed in the inter-level insulating structure 14 as shown in FIG. 2C.

The resultant semiconductor structure shown in FIG. 2C is placed in a reaction chamber of an ashing system. The photo-resist etching mask 15 is exposed to oxygen plasma created in the reaction chamber. The ashing conditions are similar to those of the prior art process described in conjunction with FIG. 1D. Thus, the photo-resist etching mask 15 is removed during the exposure to the oxygen plasma. The oxygen plasma further attacks the fluoro polymer layer 14b, and is combined with carbon in the fluoro polymer layer 14b. The oxygen plasma serves as an isotropic etcher, and the carbon and the oxygen generate carbon dioxide gas. As a result, the fluoro polymer layer 14b is sidewardly etched away in the oxygen plasma, and the contact hole 26 has a bulge portion 26a.

A problem inherent in the prior art inter-level insulating structure is the undesirable side etching during the ashing step in the oxygen plasma. The undesirable side etching forms the bulge portion 26a of the contact hole 26, and the bulge portion 26a is undesirable for the miniaturization of circuit components.

Thus, although the organic spin-on glass, the hydrogen silsesquioxane and the fluoro polymer effectively decrease the dielectric constant of the inter-level insulating layer, those organic compounds are damaged in the oxygen plasma, and the manufacturer encounters the problems in the ashing step for removing the photo-resist mask.

SUMMARY OF THE INVENTION

It is therefore an important object of the present invention to provide a process of fabricating a semiconductor device which has an ashing step for a photo-resist layer without damage to an inter-level insulating.

To accomplish the object, the present invention proposes to use plasma generated in $N_xH_y$ gas for removing a photo-resist layer from a semiconductor structure. Suffix "x" is 1 or 2, and suffix "y" is 2, 3 or 4.

In accordance with one aspect of the present invention, there is provided a process for fabricating a semiconductor device comprising the steps of preparing a semiconductor structure having a layer formed of a material to be damaged in an oxygen plasma, forming a photo-resist mask on the semiconductor structure, selectively treating the semiconductor structure with a chemical material so as to modify the semiconductor structure, the layer of the material being exposed after the treatment with the chemical material, and removing the photo-resist mask from the semiconductor structure by using a plasma produced from gas expressed as $N_xH_y$ where x is 1 or 2 and y is 2, 3 or 4.

BRIEF DESCRIPTION OF THE DRAWINGS

The features and advantages of the fabrication process will be more clearly understood from the following description taken in conjunction with the accompanying drawings in which.

DESCRIPTION OF THE PREFERRED EMBODIMENTS

First Embodiment

Figure 1A:
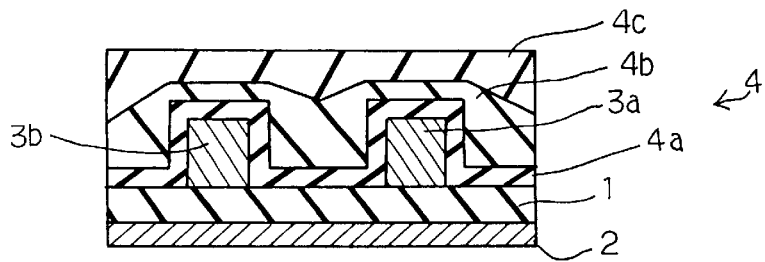
FIGS. 1A to 1G are cross sectional views showing the prior art process for fabricating the prior art inter-level insulating structure proposed by Furusawa et. al.
Figure 1B:
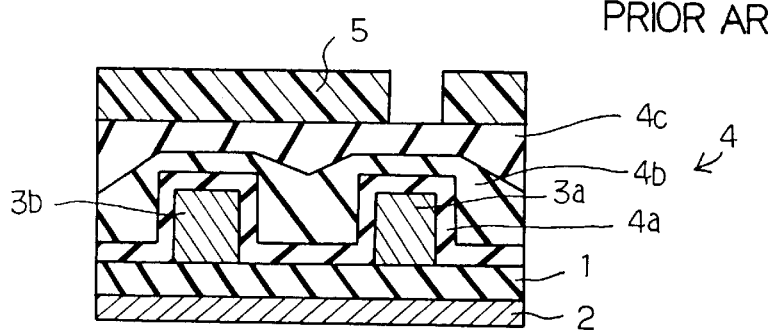
Figure 1C:
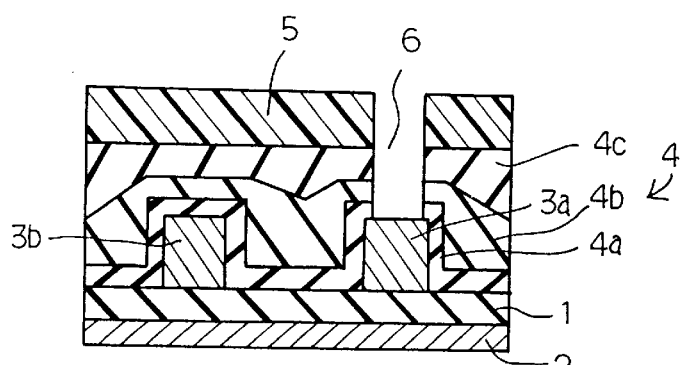
Figure 1D:
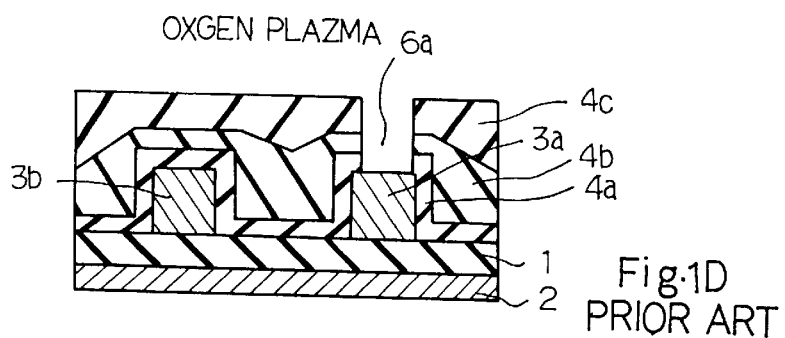
Figure 1E:
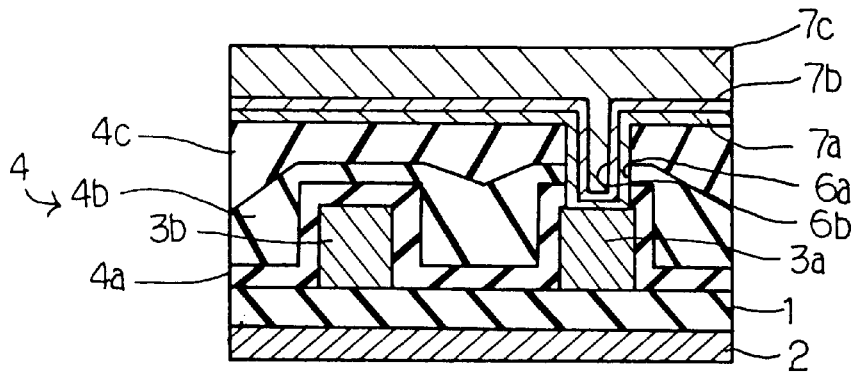
Figure 1F:
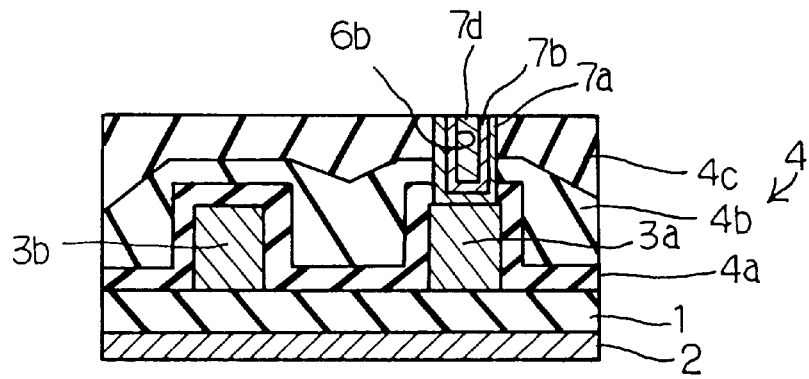
Figure 1G:
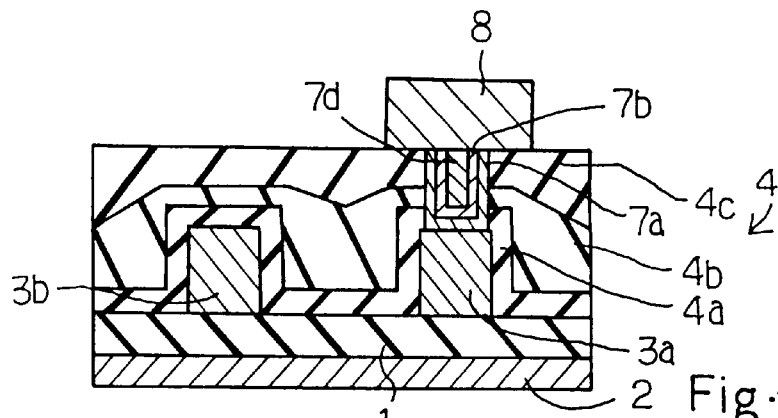
Figure 2A:
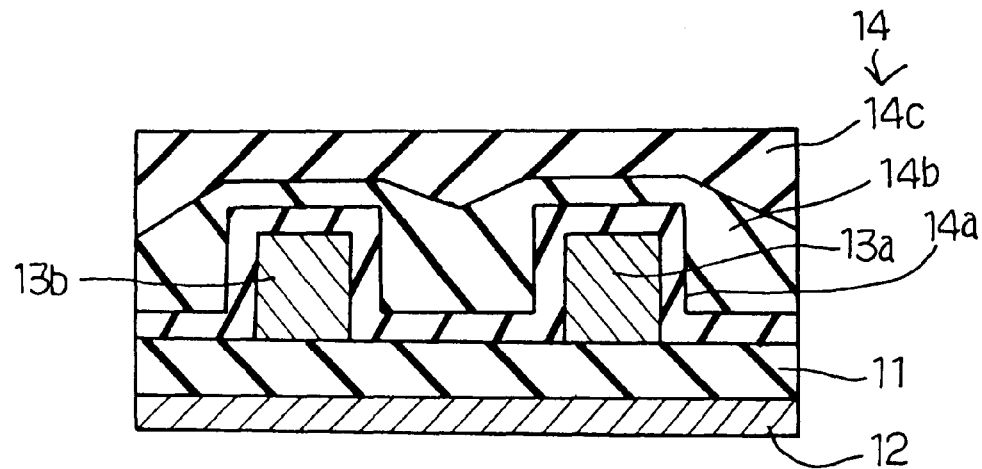
FIGS. 2A to 2D are cross sectional views showing the prior art process for fabricating the prior art inter-level insulating layer disclosed in the Semiconductor World.
Figure 2B:
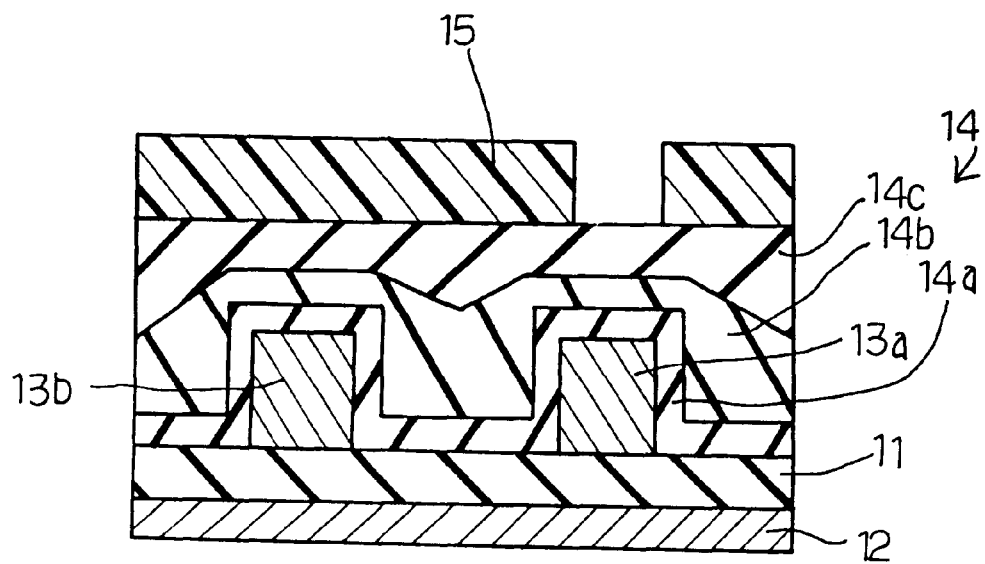
Figure 2C:
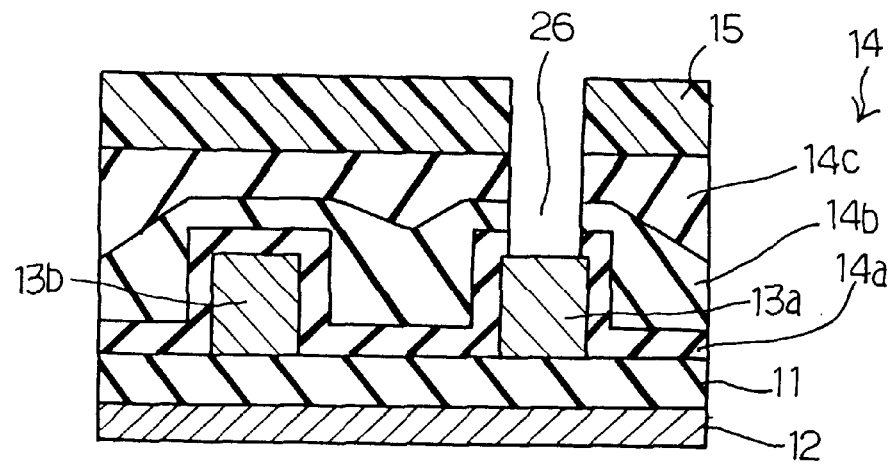
Figure 2D:
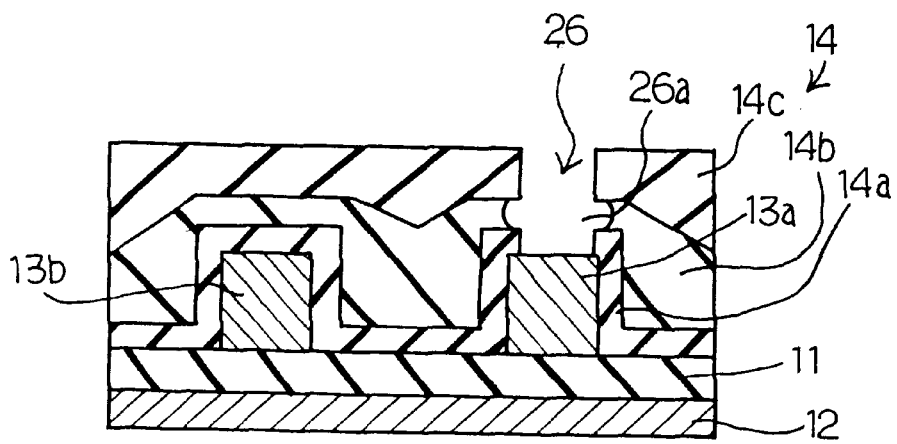

FIGS. 3A to 3G illustrate a process for fabricating a semiconductor device embodying the present invention. The process starts with preparation of an intermediate semiconductor structure. The intermediate semiconductor structure includes a silicon substrate 20 and a plasma TEOS oxide layer 21 laminated on the silicon substrate 20. Tetraethyl orthosilicate is decomposed in the presence of plasma, and silicon oxide is produced from the tetraethyl orthosilicate. The silicon oxide forms the plasma TEOS oxide layer 21.

The intermediate semiconductor structure further includes lower conductive strips 23a/23b formed of conductive material in the aluminum system and an inter-level insulating structure 24. The lower conductive strips 23a/23b are patterned on the plasma TEOS oxide layer 21 by using a deposition of the conductive material, a photo-lithography and an etching. In this instance, the inter-level insulating structure 24 has an organic spin-on glass layer 24a sandwiched between plasma TEOS oxide layers 24b and 24c.

Figure 3A:
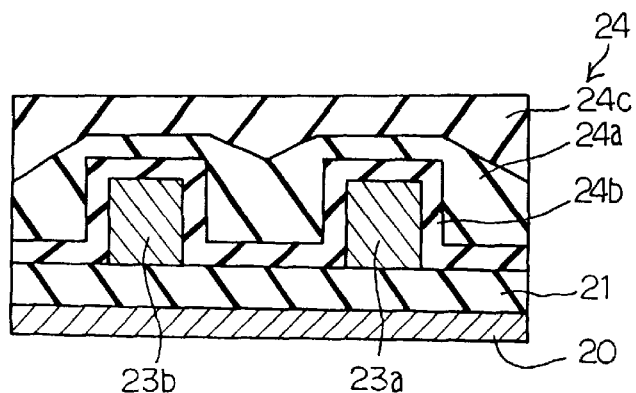
FIGS. 3A to 3G are cross sectional views showing a process for fabricating a semiconductor device according to the present invention.

The plasma TEOS oxide layer 24b is deposited to 1000 angstroms thick through the decomposition of the tetraethyl orthosilicate with the assistance with plasma, and conformably extends over the lower conductive strips 23a/23b and exposed surface of the plasma TEOS layer 21. Organic spin-on glass is spun onto the plasma TEOS oxide layer 24b, and is baked so as to form the organic spin-on glass layer 24a of 4000 angstroms thick. The step coverage is improved by the organic spin-on glass layer 24a. The plasma TEOS oxide layer 24c is firstly deposited to 8000 angstroms thick through the decomposition of tetraethyl orthosilicate, and is subjected to a chemical mechanical polishing. The chemical mechanical polishing creates a flat surface of the plasma TEOS oxide layer 24c as shown in FIG. 3A, and decreases the thickness of the plasma TEOS oxide layer 24c to 5000 angstroms.

Figure 3B:
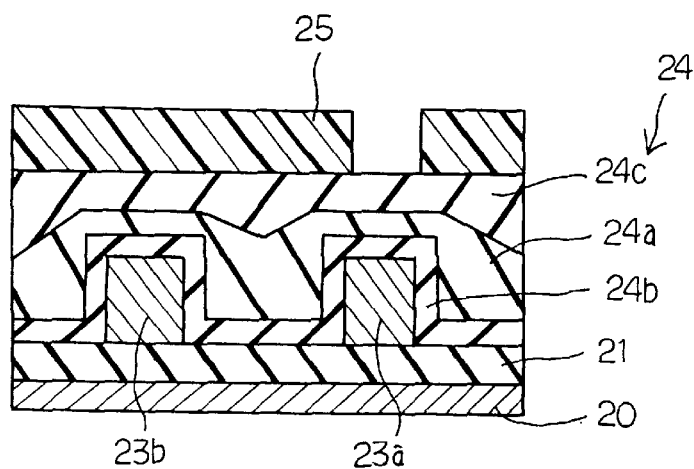

Subsequently, photo-resist solution is spread over the flat surface of the plasma TEOS oxide layer 24c, and is baked so that the inter-level insulating structure 24 is covered with a photo-resist layer. A pattern image for a contact hole is transferred from a photo mask (not shown) to the photo-resist layer, and forms a latent image in the photo-resist layer. The latent image is developed, and the photo-resist layer is formed into a photo-resist etching mask 25. The photo-resist etching mask 25 has an opening over the lower conductive strip 23a as shown in FIG. 3B.

Figure 3C:
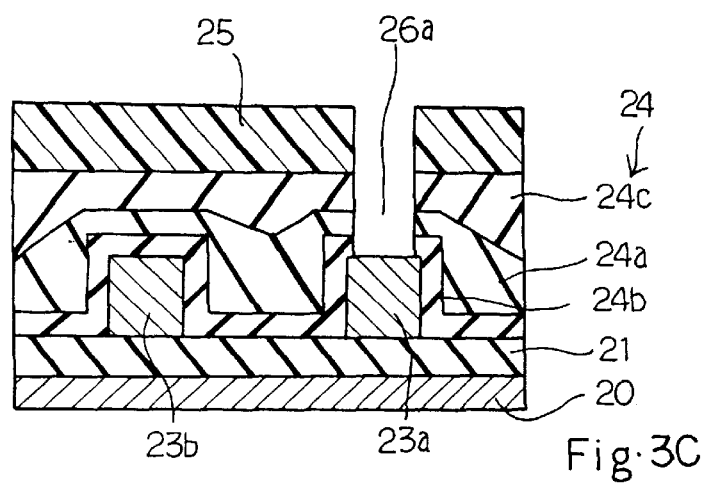

Using the photo-resist etching mask 25, the plasma TEOS oxide layers 24c/24c and the organic spin-on glass layer 24a are selectively etched by using an gaseous etcher in fluorocarbon system. A contact hole 26a is formed in the inter-level insulating structure 24 as shown in FIG. 3C, and the upper surface of the lower conductive strip 24a is exposed to the contact hole 26a.

Figure 3D:
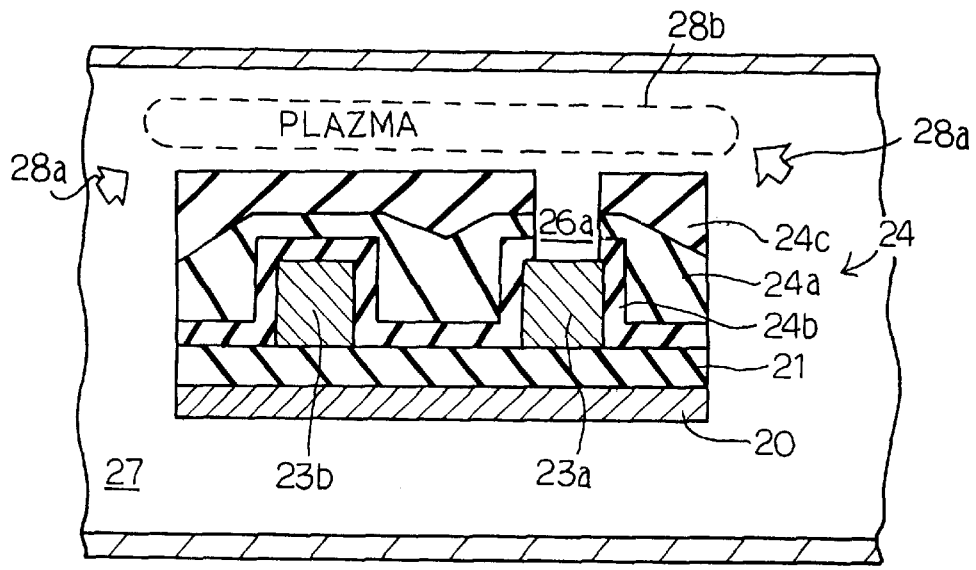

The resultant semiconductor structure is placed in a reaction chamber 27 of a plasma ashing apparatus. The reaction chamber 27 is regulated to 1.2 torr, and $NH_3$ gas 28a is supplied to the reaction chamber 27. The gas flow rate is 2.0 slm, and plasma 28b is generated from the $NH_3$ gas 28a at 1000 watts. A lamp (not shown) radiates ultra violet light, and the lamp power is 20 percent of 30 milliwatt/cm. The photo-resist etching mask 25 is ashed at 300 degrees in centigrade. The ashing speed is of the order of 8000 angstroms per minute. In this way, the photo-resist etching mask 25 is removed from the semiconductor structure as shown in FIG. 3D.

The present inventors confirmed that HCN gas was generated from the photo-resist by using a ma s spectrograph. The present inventors further confirmed that Si—$CH_3$ bond was left in the organic spin-on glass layer 24a after the removal of the photo-resist etching mask 25.

Figure 3E:
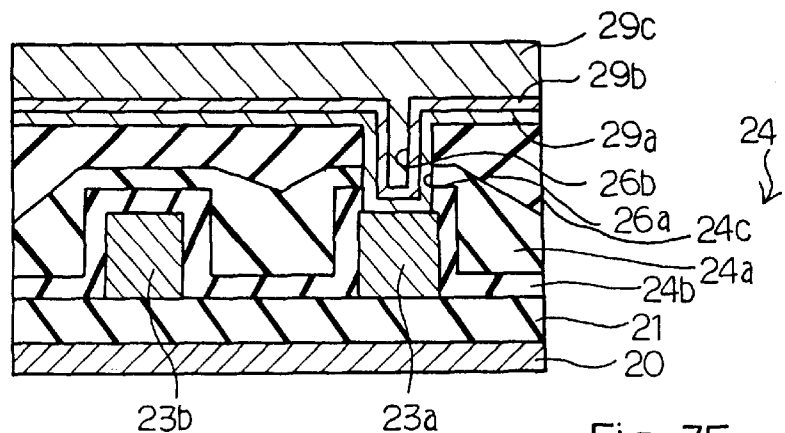

Titanium is deposited to 500 angstroms thick, and a titanium layer 29a conformably extends over the exposed surface of the inter-level insulating structure 24. Subsequently, titanium nitride is deposited to 500 angstroms thick, and a titanium nitride layer 29b is laminated on the titanium layer 29a. The titanium nitride layer 29b defines a recess 26b in the contact hole 26a. Tungsten is deposited to 5000 angstroms thick. The tungsten fills the recess 26b, and forms a blanket tungsten layer 29c as shown in FIG. 3E.

Figure 3F:
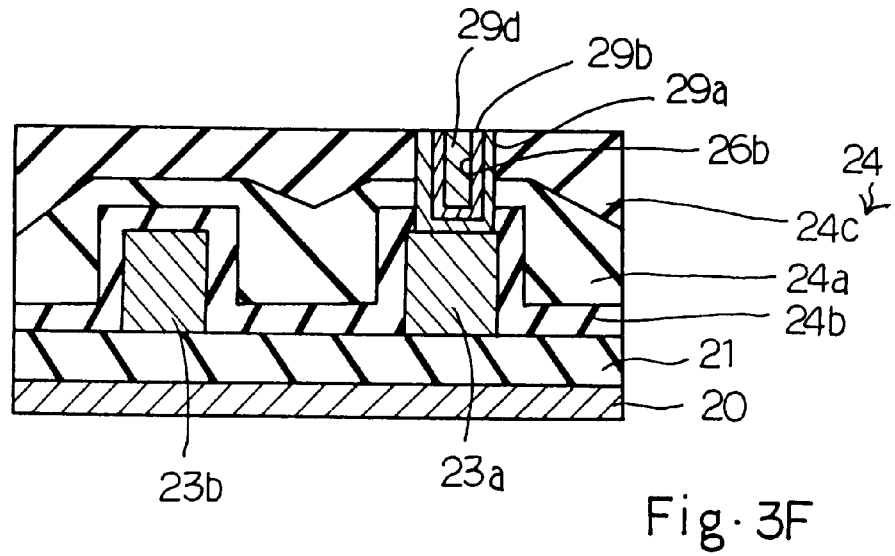

The blanket tungsten layer 29c, the titanium nitride layer 29b and the titanium layer 29a are successively etched without any etching mask until the inter-level insulating structure 24 is exposed, again. The titanium layer 29a and the titanium nitride layer 29b are left on the inner side surface of the inter-level insulating structure 24, and a tungsten plug 29d fills the recess 26b as shown in FIG. 3F.

Figure 3G:
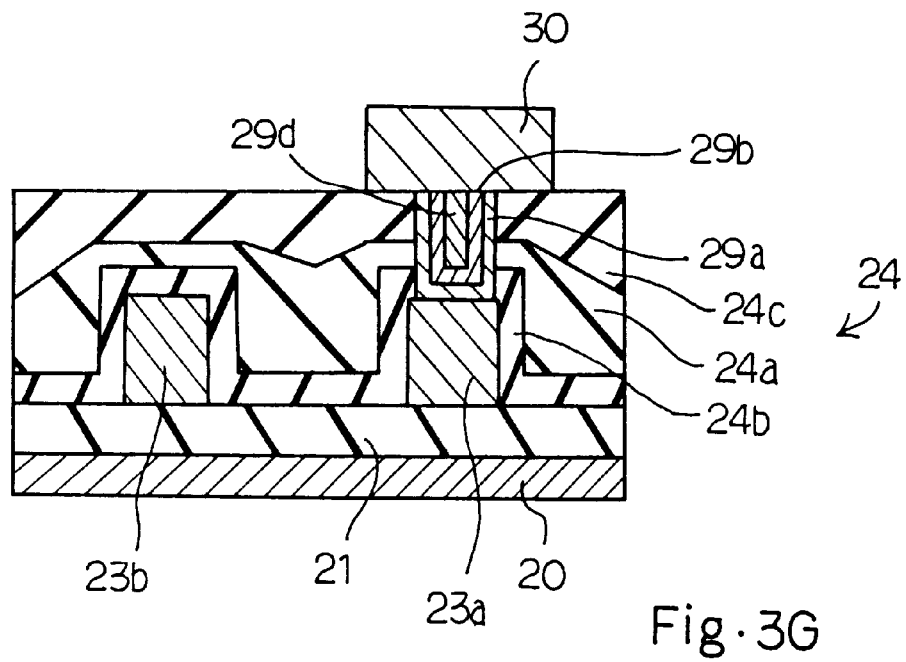

Conductive material in the aluminum system is deposited over the entire surface of the resultant semiconductor structure, and forms a conductive layer. A photo-resist etching mask (not shown) is patterned on the conductive layer, and the conductive layer is selectively etched away so that an upper metal conductive strip 30 is left on the inter-level insulating structure 24 as shown in FIG. 3G. The upper conductive strip 30 is held in contact with the tungsten plug 29d, and the tungsten plug, 29d, the titanium nitride layer 29b and the titanium layer 29a surely transfer an electric signal between the upper conductive strip 30 and the lower conductive strip 23a.

As will be understood from the foregoing description, the plasma produced from $NH_3$ gas does not make the organic spin-on glass hygroscopic, and any disconnection does not take place between the upper conductive strip 30 and the lower conductive strip 23a.

Second Embodiment

FIGS. 4A to 4D illustrate another process for fabricating a semiconductor device embodying the present invention. The process starts with preparation of an intermediate semiconductor structure. The intermediate semiconductor structure is fabricated on a silicon substrate 41, and the silicon substrate 41 is covered with a plasma TEOS oxide layer 41. The intermediate semiconductor structure further includes lower conductive strips 43a/13b formed of conductive material in the aluminum system and an inter-level insulating structure 44 extending over the lower conductive strips 43a/43b and the plasma TEOS oxide layer 42 exposed between the lower conductive strips 43a/43b.

Figure 4A:
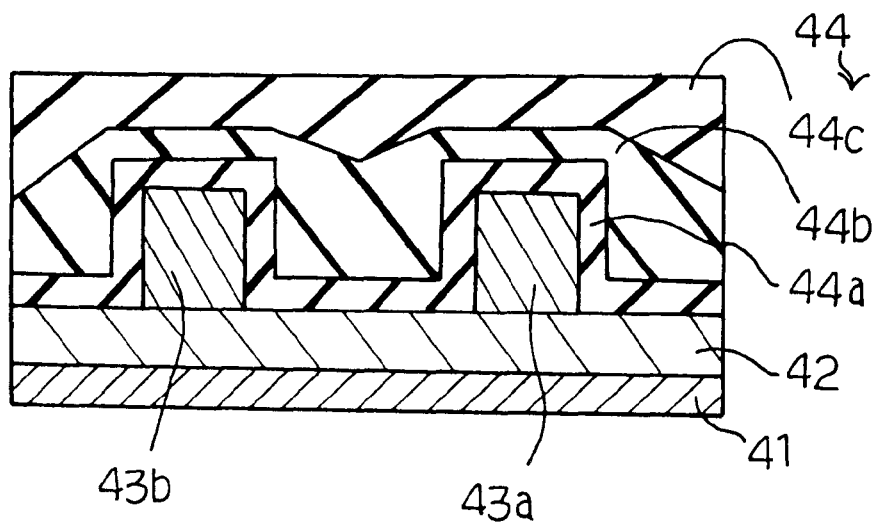
FIGS. 4A to 4D are cross sectional views showing essential steps of a process for fabricating a semiconductor device according to the present invention.

The inter-level insulating structure 44 includes a lower plasma TEOS oxide layer 44a, a fluoro polymer layer 44b laminated on the lower plasma TEOS oxide layer 44a and an upper plasma TEOS oxide layer 44c laminated on the fluoro polymer layer 44b. The lower plasma TEOS oxide layer 44a is 500 angstroms thick, and conformably extends over the lower conductive strips 43a/43b. Fluoro polymer solution 44b is spread over the lower plasma TEOS oxide layer 44a, and is baked so that the thickness is decreased to 5000 angstroms. The step coverage is improved by the fluoro polymer layer 44b. The upper plasma TEOS oxide layer 44c is firstly deposited to 8000 angstroms thick, and is subjected to a chemical mechanical polishing. The chemical mechanical polishing creates a flat surface of the upper plasma TEOS oxide layer 44c as shown in FIG. 4A, and decreases the thickness of the upper plasma TEOS oxide layer 44c.

Figure 4B:
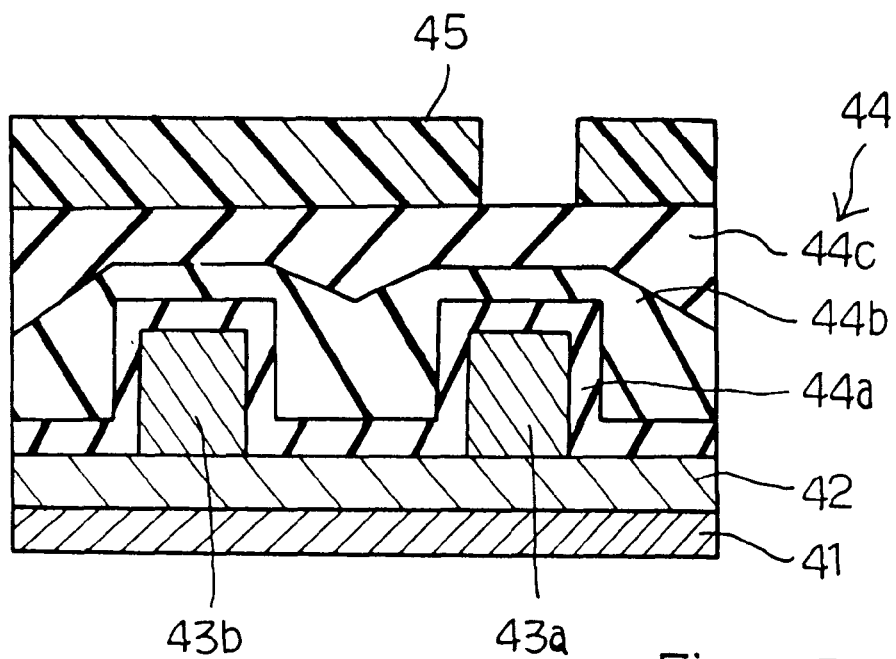

Subsequently, photo-resist solution is spread over the upper plasma TEOS oxide layer 44c and is baked so that the inter-level insulating structure 44 is covered with a photo-resist layer. A pattern image for a contact hole is transferred from a photo mask (not shown) to the photo-resist layer, and forms a latent image in the photo-resist layer. The latent image is developed, and the photo-resist layer is formed into a photo-resist etching mask 45. The photo-resist etching mask 45 has an opening over the lower conductive strip 43a as shown in FIG. 4B.

Using the photo-resist etching mask 45, the plasma TEOS oxide layers 44a/44c and the fluoro polymer layer 44b are selectively etched by using an gaseous etcher in the fluoro-carbon system. A contact hole 46 is formed in the inter-level insulating structure 44, and is substantially straight from the upper surface of the plasma TEOS oxide layer 44c to the upper surface of the lower conductive strip 43a.

Figure 4C:
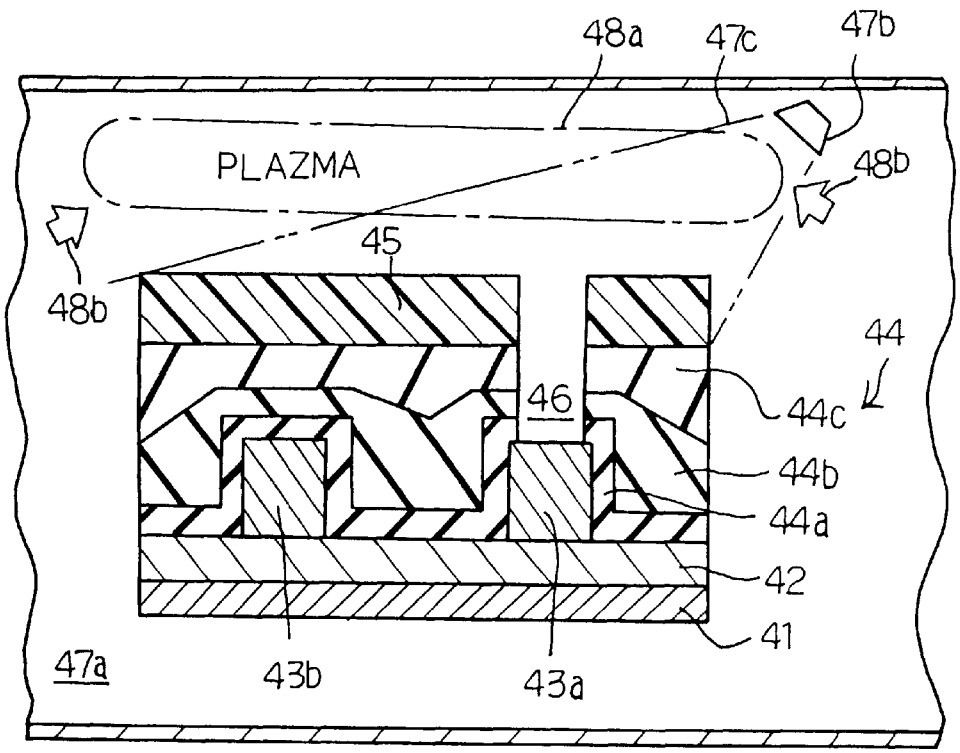

The resultant semiconductor structure is placed in a reaction chamber 47a of a plasma ashing system. A lamp 47b radiates light beam 47c to the photo-resist etching mask 45, and the photo-resist etching mask 45 is exposed to plasma 48a produced from $N_2H_4$ gas 48b as shown in FIG. 4C. The ashing conditions are as follows. The gas flow is 2.0 slm, the electric power is 1000 watts, and the ashing temperature is 250 degrees in centigrade. The lamp 47b radiates ultra violet light, and the lamp power is 40 percent. The photo-resist etching mask 45 is removed during the exposure to the plasma 48a, and the ashing speed is about 9000 angstroms per minute. Thus, the photo-resist etching mask 45 is removed from the semiconductor structure. The plasma hardly etches the fluoro polymer layer 44b, and the contact hole 46 keeps straight. This is because of the fact that the plasma 48a vaporizes the photo-resist etching layer 45 in the exposure of light radiated from the lamp. The fluoro polymer layer 44b is exposed to the contact hole 46, and the light hardly reaches the fluoro polymer layer 44b.

Figure 4D:
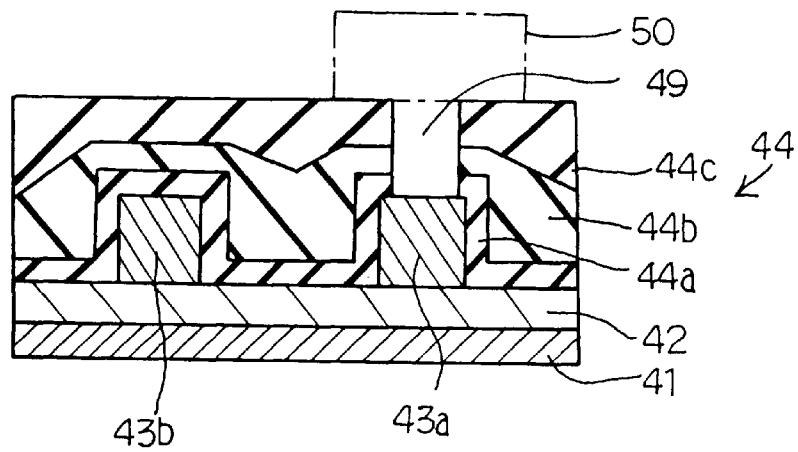

The inner wall exposed to the contact hole 46 is covered with a titanium layer and a titanium nitride layer, and a recess defined by the titanium nitride layer is filled with a tungsten plug as similar to the first embodiment. The titanium layer, the titanium nitride layer and the tungsten plug are labeled with reference numeral 49, and an upper conductive layer 50 is formed in the inter-level insulating structure 44 as shown in FIG. 4D.

As will be understood from the foregoing description, the plasma produced from the $N_2H_4$ gas 48b does not etches the fluoro polymer layer 44b, and the contact hole 46 is never deformed during the plasma ashing.

Although particular embodiments of the present invention have been shown and described, it will be apparent to those skilled in the art that various changes and modifications may be made without departing from the spirit and scope of the present invention.

For example, the plasma 28b/48b may be produced from $N_2H_2$ gas.

A photo-resist mask may be used in an ion-implantation. In this instance, the organic layer is exposed to the plasma produced from $N_xH_y$ gas together with the photo-resist ion-implantation mask during the plasma ashing step.

A photo-resist etching mask may be used for forming a groove in the inter-level insulating structure 24. A hydrogen silsesquioxane layer may be used for electrical isolation of a conductive layer formed in the groove.

The plasma produced from $N_xH_y$ gas is desirable for other organic compound to be damaged by the oxygen plasma such as, for example, hydrogen silsesquioxane, inorganic material to be damaged by the oxygen plasma such as, for example, amorphous carbon and fluorinated amorphous carbon and any porous material having Si—$CH_3$ bond or Si—H bond. Typical examples of the porous material are expressed by the following formulae.

where a, b and c are integers.

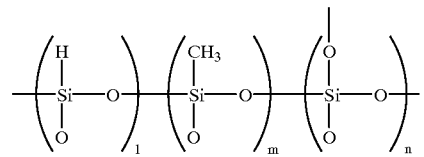

where l, m and n are integers.

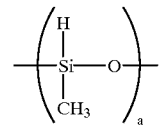

where a is an integer.

The $N_xH_y$ gas may be mixed with other gas such as, for example, $H_2$ gas, $N_2$ gas and Ar gas.

What is claimed is:
1. A process for fabricating a semiconductor device, comprising the steps of:
   a) preparing a semiconductor structure having a layer formed of a material to be damaged by an oxygen plasma;
   b) forming a photo-resist mask on said semiconductor structure;
   c) selectively treating said semiconductor structure with a chemical material so as to modify said semiconductor structure said layer of material being exposed after the treatment with said chemical material; and
   d) removing said photo-resist mask from said semiconductor structure by using a plasma produced from gas expressed as $N_xH_y$ where x is 1 or 2 and y is 2, 3 or 4.

2. The process as set forth in claim 1, in which said layer of said material becomes hygroscopic when said material is exposed to said oxygen plasma.

3. The process as set forth in claim 2, in which said material is selected from the group consisting of an insulating organic compound having a bond replaced with Si—OH during an exposure to said oxygen plasma and an insulating inorganic compound having a bond replaced with Si—OH during said exposure to said oxygen plasma.

4. The process as set forth in claim 3, in which said insulating inorganic compound comprises hydrogen silsesquioxane.

5. The process as set forth in claim 3, in which said insulating organic compound comprises organic spin-on glass.

6. The process as set forth in claim 1, in which said material comprises organic resin to be etched by said oxygen plasma.

7. The process as set forth in claim 6, in which said organic resin is fluorine-contained organic resin, and said photo-resist mask is removed under a radiation of light in said removing.

8. The process as set forth in claim 1, in which said material is selected from the group consisting of organic compound having one of Si—CH₃ bond and Si—H bond, organic resin to be etched by said oxygen plasma, amorphous carbon, fluorinated amorphous carbon and porous material having one of Si—CH₃ bond and Si—H bond.

9. The process as set forth in claim 1, in which said chemical material comprises an etching gas for patterning said layer formed of said material.

10. The process as set forth in claim 9, in which said etching gas is in a fluorocarbon system.

11. The process as set forth in claim 9, in which said etching gas forms a hole passing through said layer formed of said material to be damaged by said oxygen plasma.

* * * * *